(12) United States Patent
Liaw

(10) Patent No.: US 10,763,269 B2
(45) Date of Patent: Sep. 1, 2020

(54) ANTI-FUSE CELL AND CHIP HAVING ANTI-FUSE CELLS

(71) Applicant: Taiwan Semiconductor Manufacturing Co., Ltd., Hsinchu (TW)

(72) Inventor: Jhon-Jhy Liaw, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/172,840

(22) Filed: Oct. 28, 2018

(65) Prior Publication Data

US 2020/0135746 A1   Apr. 30, 2020

(51) Int. Cl.
| H01L 27/11 | (2006.01) |
| H01L 27/112 | (2006.01) |
| H01L 23/528 | (2006.01) |
| H01L 23/522 | (2006.01) |
| H01L 23/525 | (2006.01) |

(52) U.S. Cl.
CPC ...... *H01L 27/11206* (2013.01); *H01L 23/528* (2013.01); *H01L 23/5226* (2013.01); *H01L 23/5252* (2013.01)

(58) Field of Classification Search
CPC ............. H01L 21/8239; H01L 23/5226; H01L 23/5228; H01L 23/5252; H01L 23/528; H01L 27/1052; H01L 27/11206; H01L 27/11286; H01L 28/24

USPC .......................................... 257/379; 438/382
See application file for complete search history.

(56) References Cited

U.S. PATENT DOCUMENTS

| 6,580,145 | B2 | 6/2003 | Wu et al. |
| 6,649,456 | B1 | 11/2003 | Liaw |
| 6,972,450 | B2 | 12/2005 | Liaw |
| 7,364,961 | B2 | 4/2008 | Liaw |
| 9,773,792 | B1 | 9/2017 | Liaw |
| 2010/0232203 | A1 | 9/2010 | Chung et al. |
| 2013/0134374 | A1* | 5/2013 | Kim ........................ H01L 45/00 257/2 |
| 2014/0001568 | A1* | 1/2014 | Wang ................ H01L 27/11286 257/379 |

* cited by examiner

*Primary Examiner* — Brook Kebede
(74) *Attorney, Agent, or Firm* — JCIPRNET

(57) ABSTRACT

An anti-fuse cell includes a control device and an anti-fuse element is introduced. The control device includes a source node, a drain node and a gate node, wherein the gate node is electrically coupled to a word line and the drain node is electrically coupled to a bit line. The anti-fuse element includes a first conductive layer, a second conductive layer and a dielectric layer, wherein the dielectric layer is disposed between the first conductive layer and the second conductive layer. The second conductive layer of the anti-fuse element is physically stacked upon a conductive layer and electrically connected to the source node of the control device, and first conductive layer is electrically coupled to a program line through a via. An anti-fuse cell having multiple anti-fuse elements and a chip having a plurality of anti-fuse cells are also introduced.

20 Claims, 13 Drawing Sheets

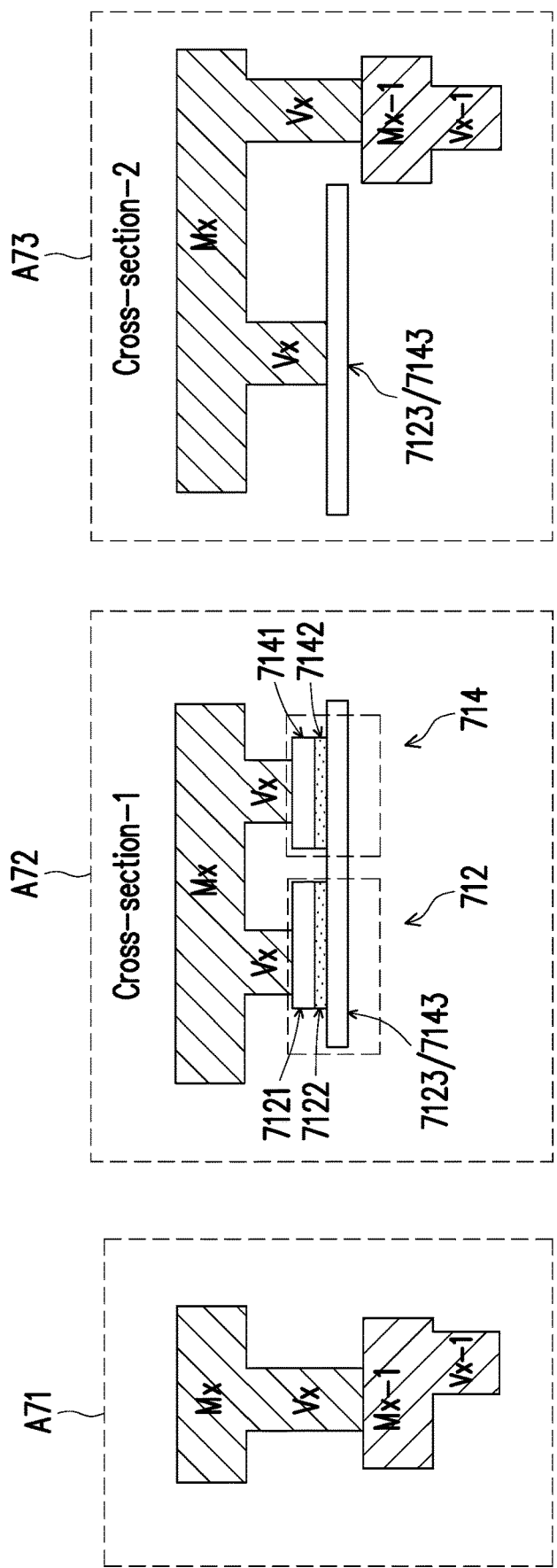

ANTI-FUSE CELL AND CHIP HAVING ANTI-FUSE CELLS

BACKGROUND

An anti-fuse or an anti-fuse element is an electrical device that is designed to create a permanent electrically conductive path in a microelectronic device. Typically, when a voltage across the anti-fuse exceeds a certain level, the permanent electrically conductive path is created.

An anti-fuse element may be formed by a transistor such as a Metal-Oxide Semiconductor Field-Effect Transistor (MOSFET). However, the anti-fuse element formed by the MOSFET is easy influenced by device tuning and therefore reducing the anti-fuse reliability as well as operation margin. Another concern with the anti-fuse element is a breakdown path which is a path from the gate electrode to either the channel or the drain side of the MOSFET. The breakdown path of the MOSFET induces a larger resistance variation and impacts the read current and therefore degrades the read margin.

Therefore, it is desirable in the microelectronic field to provide an anti-fuse cell and a chip having a plurality of anti-fuse cells that have high reliability and high operation requirement.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A to 7D illustrate different views of a non-anti-fuse area and an anti-fuse area according to another embodiment of the disclosure.

DETAILED DESCRIPTION

Figure 1:
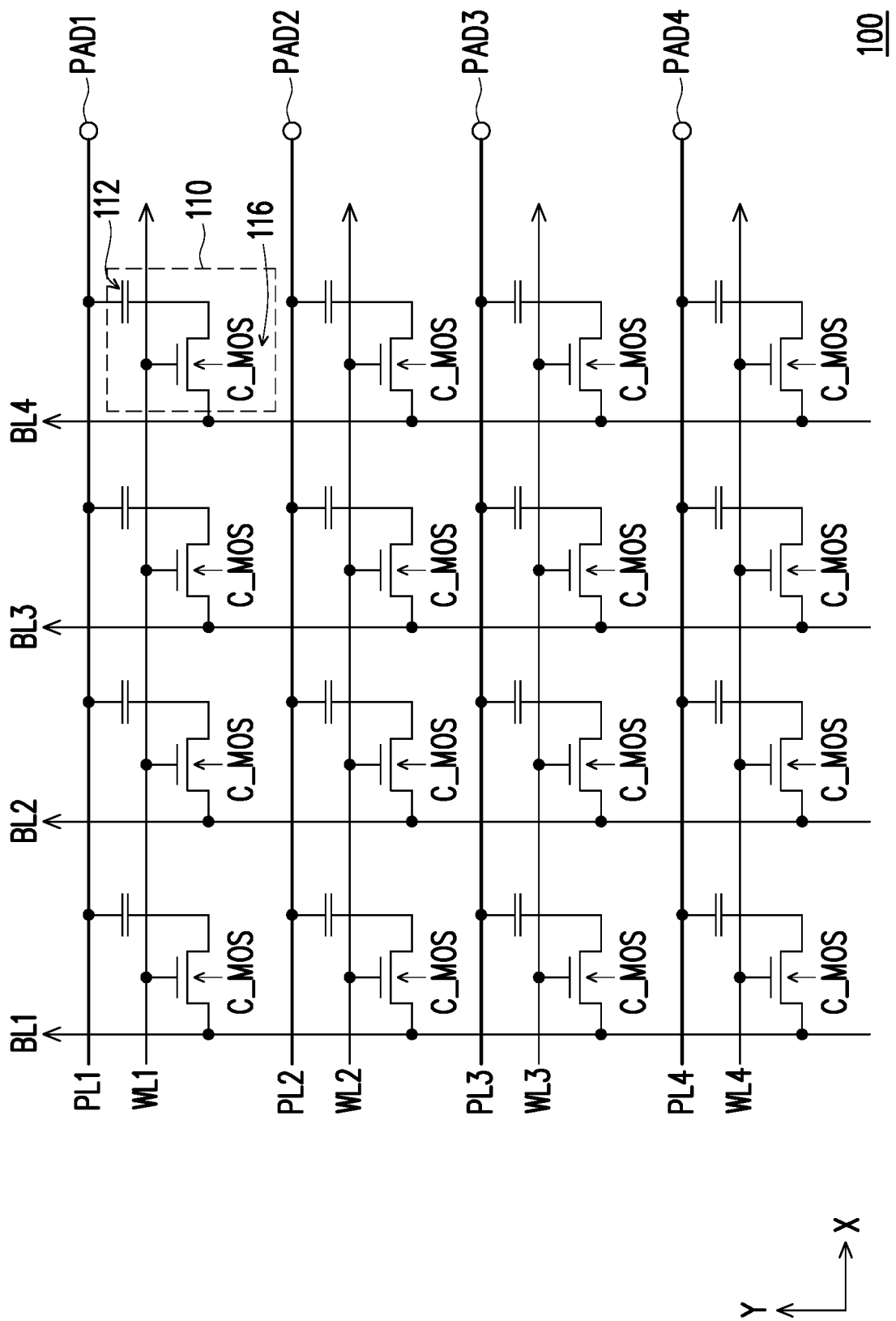
FIG. 1 illustrates a schematic diagram of a chip having a plurality of anti-fuse cells according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a chip 100 includes a plurality of anti-fuse cells 110 arranged in an array. Each of the anti-fuse cells 110 is coupled to one of bit lines BL1 to BL4, one of word lines WL1 to WL4 and one of program lines PL1 to PL4. The word lines WL1 to WL4 are arranged in parallel to the program lines PL1 to PL4, and the word lines WL1 to WL4 are perpendicular to the bit lines BL1 to BL4. In the examples shown in FIG. 1, there are four bit lines BL1 to BL4, four word lines WL1 to WL4 and four program lines PL1 to PL4, but the disclosure is not limited thereto. A number of bit lines, word lines, and program lines in the chip 100 are selected according to the designed needs.

Each of the anti-fuse cells 110 includes an anti-fuse element 112 and a control device 116. The control device 116 includes a gate node, a drain node and a source node, where the gate node is coupled to one of the word lines WL1 to WL4, the drain node is coupled to one of the bit lines BL1 to BL4, and the source node is coupled to the anti-fuse element 112. The anti-fuse element 112 is coupled between the source node of the control device 116 and one of the program lines PL1 to PL4. The control device 116 can be a Complementary Metal Oxide Semiconductor (CMOS) transistor, but the disclosure is not limited thereto.

In some embodiment of the disclosure, each of the program line PL1 to PL4 is coupled to one of the landing pads PAD1 to PDA4 which are located at a boundary of the array of the anti-fuse cells 110. The landing pads PAD1 to PAD4 may be electrically coupled the program lines PL1 to PL4 to a driver circuit (not shown) located outside of the anti-fuse cell array, such that the driver circuit may program the anti-fuse element 112 of each of the anti-fuse cell 110.

Figure 2B:
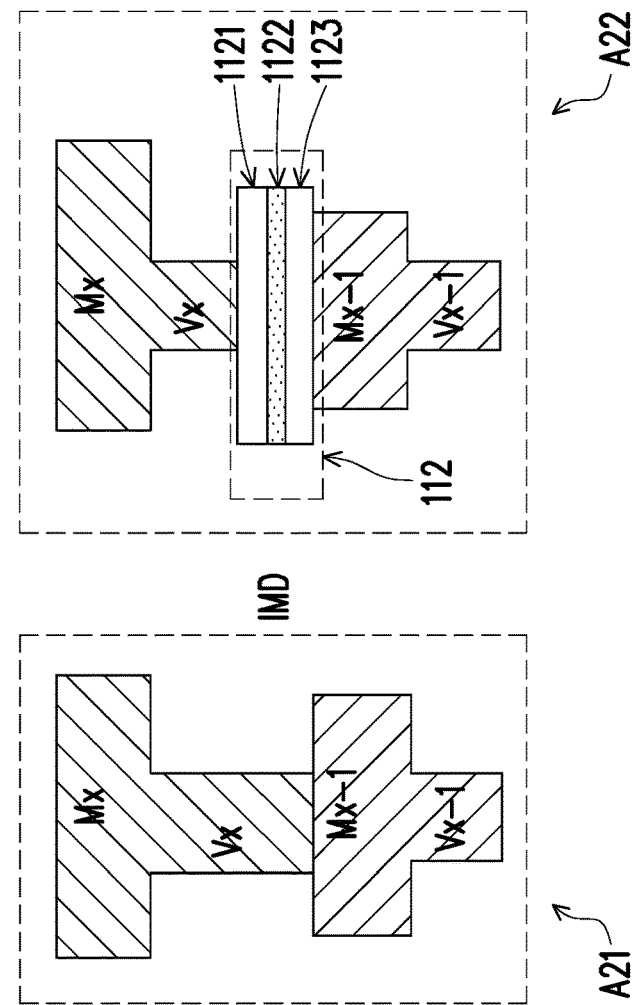
FIG. 2B illustrates a cross-sectional view of a chip's portion including an anti-fuse area and a non-anti-fuse area according to an embodiment of the disclosure.
Figure 2A:
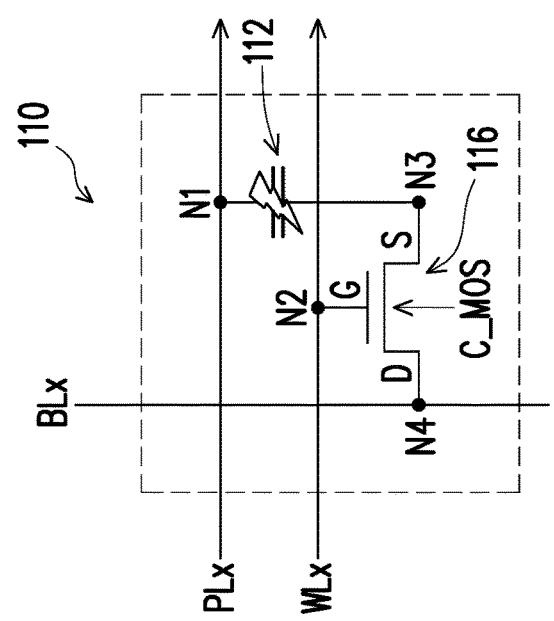
FIG. 2A illustrates a schematic diagram of an anti-fuse cell according to an embodiment of the disclosure.

Referring to FIG. 2A, the anti-fuse cell 110 is coupled to a bit line BLx, a word line WLx and a program line PLx. The gate node G of the control device 116 is coupled to the word line WLx through a node N2, the drain node D of the control device 116 is coupled to the bit line BLx through a node N4, and the source node S of the control device 116 is coupled to the anti-fuse element 112 through a node N3. The anti-fuse element 112 is coupled to the program line PLx through node N1.

Referring to FIG. 2B, a cross-sectional view of a non-anti-fuse area A21 and an anti-fuse area A22 are illustrated. The non-anti-fuse area A21 and the anti-fuse area A22 are separated by at least one inter-metal dielectric (IMD) layer. Each of the non-anti-fuse area A21 and the anti-fuse area A22 includes a conductive layer Mx and a lower-level conductive layer Mx−1, where the conductive layer Mx is coupled to the lower-level conductive layer Mx−1 through a via Vx. The lower-conductive layer Mx−1 may be coupled to the another conductive layer Mx−2 (not shown) or any other electronic components through a via Vx−1.

A difference between the non-anti-fuse area A21 and the anti-fuse area A22 is that the anti-fuse area A22 further includes an anti-fuse element 112 coupled between the via Vx and the lower-level metal layer Mx−1. The anti-fuse element 112 includes a top conductive layer 1121, a bottom conductive layer 1123 and a dielectric layer 1122 disposed between the top conductive layer 1121 and the bottom conductive layer 1123.

The bottom conductive layer 1123 of the anti-fuse element 112 may be physically stacked upon the lower-level conductive layer Mx−1, and is electrically connected to the source node G of control device 116. The top conductive layer 1121 of the anti-fuse element 112 is electrically connected to program line PLx through the via Vx. Since the bottom conductive layer 1123 is physically stacked upon the lower-level conductive layer Mx−1, a resistance of the anti-fuse element and control device is reduced, thereby improving the flow of current through anti-fuse element 112.

In some embodiments of the disclosure, the top conductive layer 1121 and the bottom conductive layer 1123 of the anti-fuse element 112 are metal layers. The top conductive layer 1121 and the bottom conductive layer 1123 may be formed by either single metal material or multiple metal stacked materials selected from a group consisting of Ti, TiN, Ni, Mo, Pt, Co, Ru, W, TaN, Cu, and any combination thereof. It should be noted that the disclosure is not limited to the above-mentioned materials, any conductive materials fall within the scope of the disclosure.

The dielectric layer 1122 can be a single dielectric material or multiple stacked dielectric materials. The material of the dielectric layer 1122 is not limited to any specific material. In an example, the material of the dielectric layer 1122 is selected from a group consisting of $SiO_2$, SiOC, SiON, SiOCN, $Si_3N_4$, Carbon content oxide, Nitrogen content oxide, Carbon and Nitrogen content oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, and any combination thereof.

A thickness of the dielectric layer 1122 may influence to the formation and conductivity of the permanent electrically conductive path of the anti-fuse element 112. The thickness of the dielectric layer 1122 is selected according to designed needs. In an examples, the thickness of the dielectric layer 112 is selected to be within a range of 5 Å to 50 Å, wherein Å is angstrom unit.

Figure 2C:
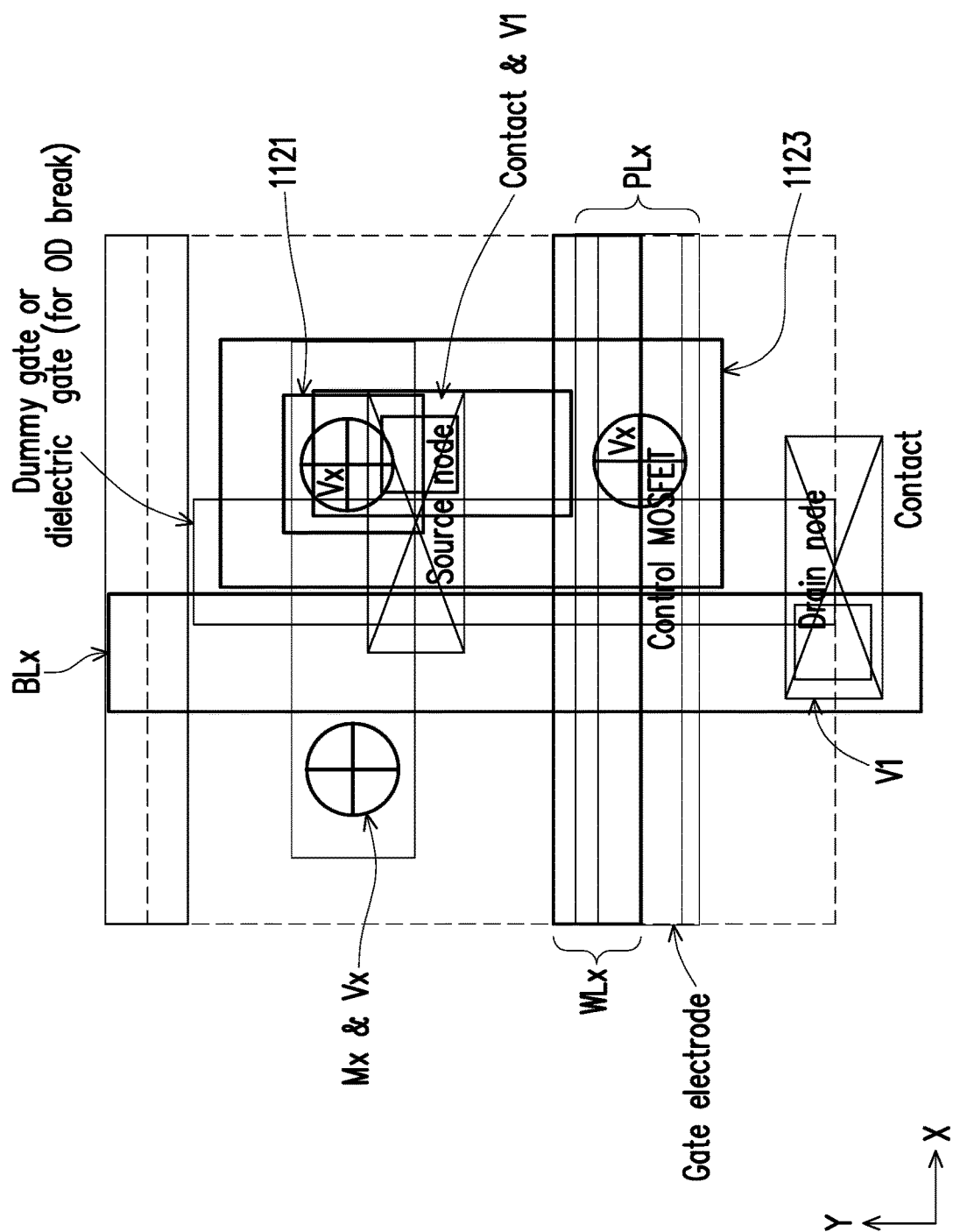
FIG. 2C illustrates a layout of the anti-fuse cell according to an embodiment of the disclosure.

Referring to FIG. 2C, a layout of the anti-fuse cell with the anti-fuse element and the control device is illustrated. The drain node of the control device is coupled to the bit line BLx through a contact and via V1. The top conductive layer 1121 and the bottom conductive layer 1123 are coupled to the program line and the source node of the control device respectively through a number of vias Vx. FIG. 2C also illustrates the area for dummy gate or dielectric gate for oxide diffusion (OD) break.

Figure 3:
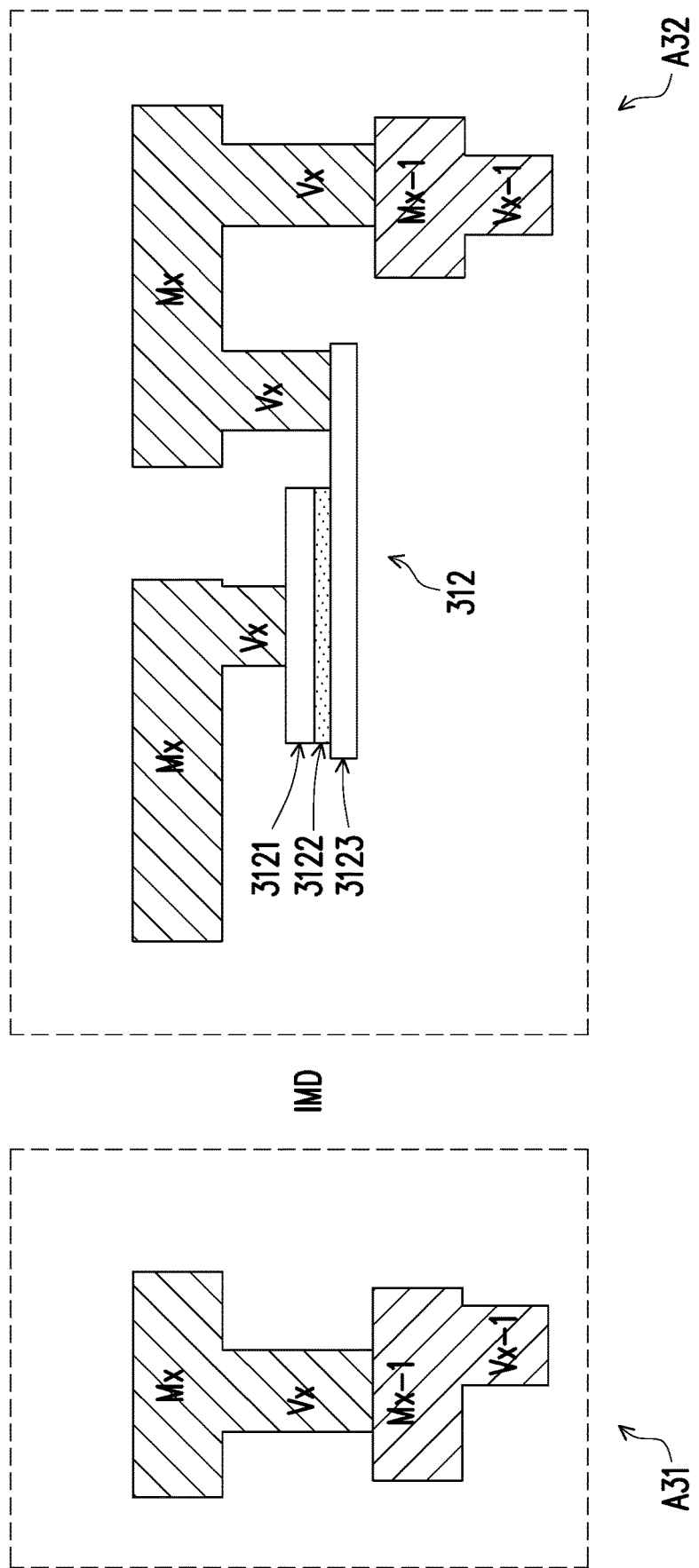
FIG. 3 illustrates a cross-sectional view of a chip's portion including an anti-fuse area and a non-anti-fuse area according to another embodiment of the disclosure.

Referring to FIG. 3, a cross-sectional view of a non-anti-fuse area A31 and an anti-fuse area A32 is illustrated. The non-anti-fuse area A31 is separated from the anti-fuse area A32 by at least IMD layer. The anti-fuse area A32 includes an anti-fuse element 312 that has a top conductive layer 3121, a bottom conductive layer 3123 and a dielectric layer 3122. The dielectric layer 3122 is disposed between the top conductive layer 3121 and the bottom conductive layer 3123.

Referring to FIG. 2B and FIG. 3B, the non-anti-fuse area A31 is similar to the non-anti-fuse area A21. In addition, the connection path of the anti-fuse element 312 to the source node of the control device in FIG. 3 is different from the connection path of the anti-fuse element 212 to the source node of the control device. Particularly, the anti-fuse element 212 in FIG. 2B is physically stacked upon the lower-layer conductive layer Mx−1. The anti-fuse element 312 in FIG. 3B is coupled to the lower-layer conductive layer Mx−1 through a number of vias and the conductive layer Mx. Furthermore, the length of bottom conductive layer 3123 of the anti-fuse element 312 is extended to be coupled to the via Vx.

Figure 4:
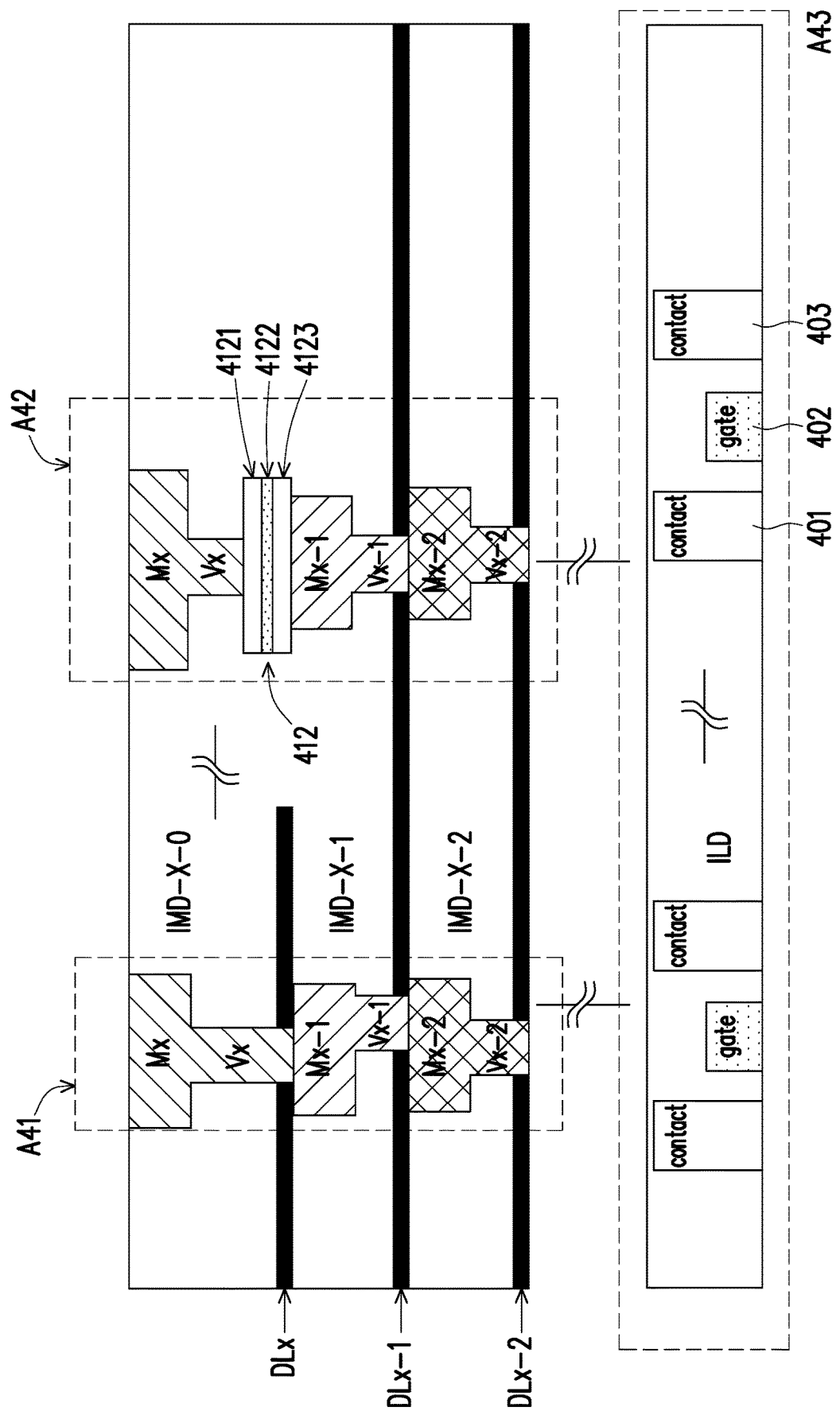
FIG. 4 illustrates a cross-sectional view of chip's portion including an anti-fuse area, a non-anti-fuse area and a control device area according to an embodiment of the disclosure.

Referring to FIG. 4, a cross-sectional view of a non-anti-fuse area A41, an anti-fuse area A42, and a control device area A43 is illustrated. The non-anti-fuse area A41 and the anti-fuse area A42 are separated by IMD layers IMD-X-0, IMD-X-1, and IMD-X-2. Each of the non-anti-fuse area A41 and the anti-fuse area A42 includes a conductive layer Mx, Mx−1 and Mx−2, where the conductive layer Mx−1 is located at a lower level than the conductive layer Mx, and the conductive layer Mx−2 is located at a lower level than the conductive layer Mx−1. The conductive layer Mx is coupled to the conductive layer Mx−1 through via Vx; the conductive layer Mx−1 is coupled to the conductive layer Mx−2 through via Vx−1; and the conductive layer Mx−2 is coupled to the lower-level metal layer or other component through the via Vx−2.

As shown in FIG. 4, the non-anti-fuse area A41 and the anti-fuse area A42 further include a plurality of dielectric layers DLx, DLx−1 and DLx−2 for via etch stop purpose. The dielectric layers DLx, DLx−1 and DLx−2 may prevent damage to the underlying conductive layer or underlying semiconductor material during an etching process. The dielectric layers DLx, DLx−1 and DLx−2 are located at a conjunction layer between the upper via layer and a lower conductive layer. The dielectric layers DLx, DLx−1 and DLx−2 have openings where the via penetrates through the dielectric layers DLx, DLx−1 and DLx−2. In an embodiment of the disclosure, the material of via etch stop dielectric layer DLx, DLx−1 and DLx−2 is different from the material of the IMD layer, or oxide base with carbon content, or nitrogen content, or a combination thereof.

A difference between the non-anti-fuse area A41 and the anti-fuse area A42 is that the anti-fuse element 412 is included in the anti-fuse area A42 but is not included in the non-anti-fuse area A41. Another difference is that the via etch stop dielectric layer DLx exists in the non-anti-fuse area A41 but does not exist in the anti-fuse area A42.

The control device area A43 includes a number of node contacts 401, 402, and 403. The node contacts 401, 402, and 403 may be coupled to the source node, the gate node and the drain node of the control device, respectively. The node contact 401 may be electrically coupled to the bottom conductive layer 4123 of the anti-fuse element 412, the node contact 402 is electrically coupled to one of the word lines (e.g., world lines WL1 to WL4 in FIG. 1), and the node contact 403 is electrically coupled to one of the bit lines (e.g., bit lines BL1 to BL4 in FIG. 1).

Figure 5:
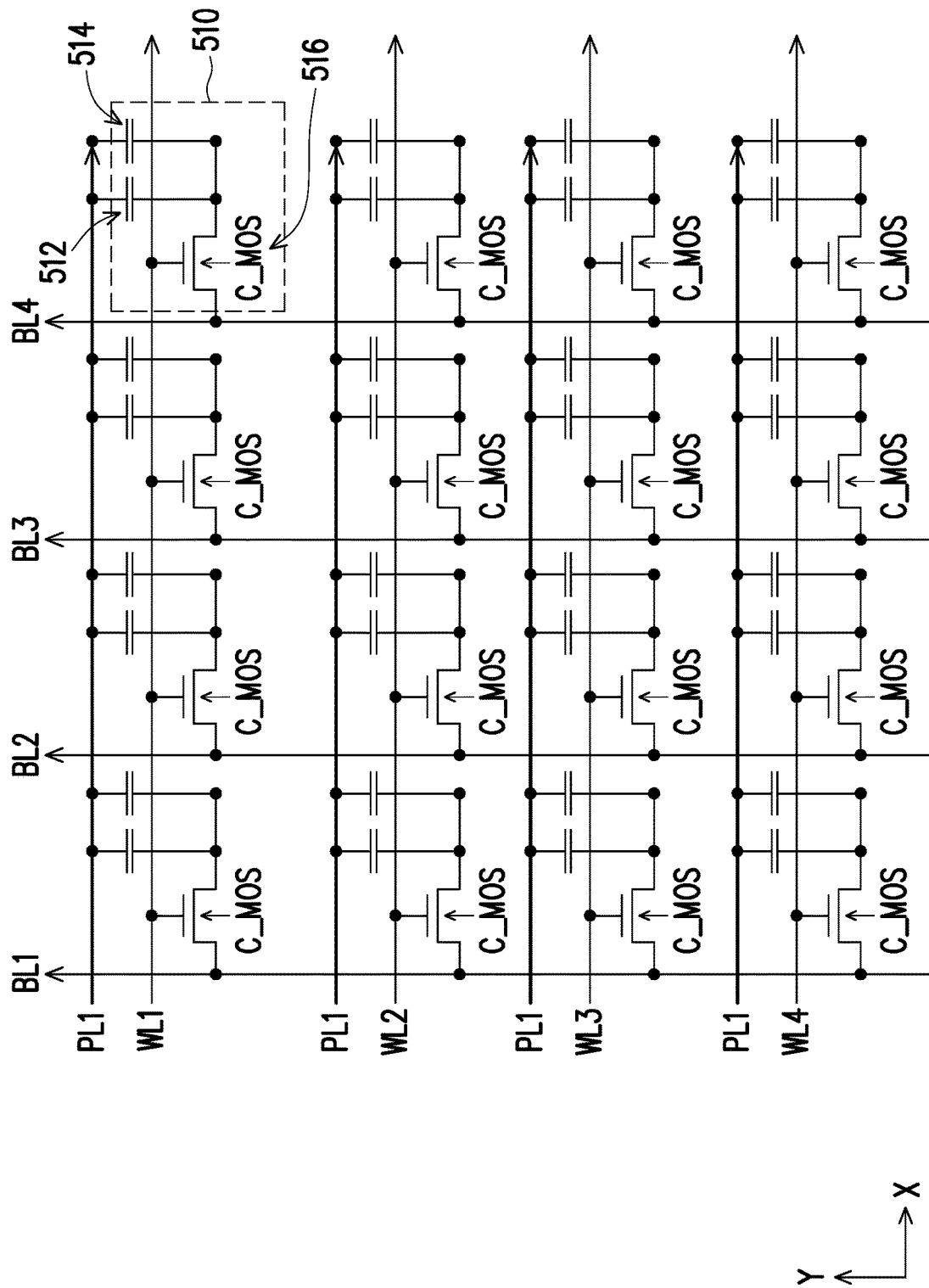
FIG. 5 illustrates a schematic diagram of a chip having a plurality of anti-fuse cells according to another embodiment of the disclosure.

Referring to FIG. 5, a chip 500 includes a plurality of anti-fuse cells 510 which is arranged in an anti-fuse array. Each of the anti-fuse cells 510 is coupled to one of the bit line BL1 to BL4, one of the word lines WL1 to WL4 and one of the program lines PL1 to PL4. Each of the anti-fuse cells 510 includes anti-fuse elements 512, 514 and a control device 516. The anti-fuse element 512 is coupled to the anti-fuse element 514 in parallel.

Figure 6:
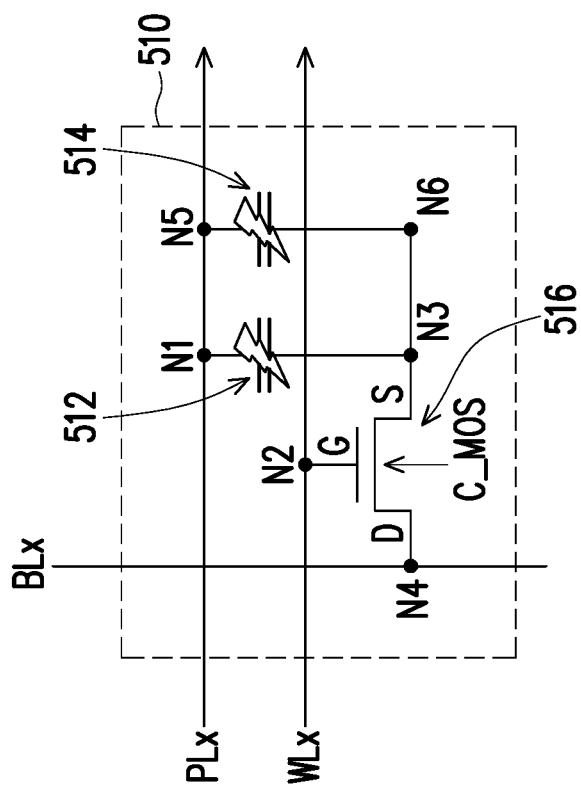
FIG. 6 illustrates a schematic diagram of an anti-fuse cell with multiple anti-fuse elements according to an embodiment of the disclosure.

Referring to FIG. 6, the anti-fuse cell 510 is coupled to a bit line BLx, a word line WLx and a program line PLx. The gate node G of the control device 516 is coupled to the word line WLx through a node N2; the drain node D of the control device 516 is coupled to the bit line BLx through a node N4; and the source node S of the control device 516 is coupled to the anti-fuse elements 512, 514 through nodes N3, N6. The anti-fuse elements 512, 514 are coupled to the program line PLx through nodes N1, N5. Since nodes N1 is electrically coupled to the node N5 and the node N3 is electrically coupled to the node N6, the anti-fuse elements 514 is coupled to the anti-fuse element 516 in parallel. In addition, as each of the anti-fuse cells include multiple anti-fuse elements 512, 514 coupled in parallel, the programming yield is improved.

Figure 7D:
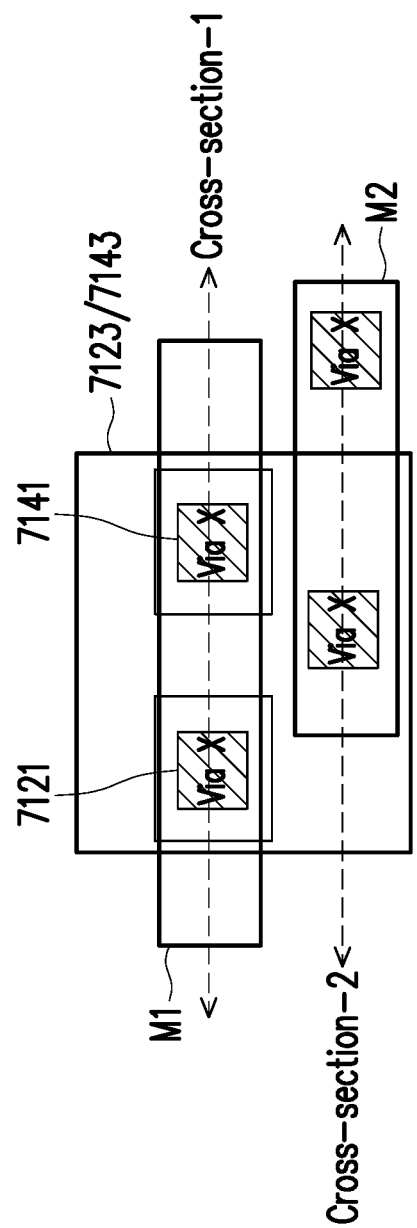

Referring to FIG. 7A to FIG. 7D, different views of a non-anti-fuse area and an anti-fuse area are illustrated. In FIG. 7A, a non-anti-fuse area A71 includes a conductive layer Mx and a lower-level conductive layer Mx–1, where the conductive layer Mx is coupled to the lower-level conductive layer Mx–1 through a via Vx. The lower-conductive layer Mx–1 may be coupled to the another conductive layer Mx–2 (not shown) or any other electronic components through a via Vx–1. FIG. 7B shows an anti-fuse area A72 according to the cross-section-1 in FIG. 7D, and FIG. 7C shows an anti-fuse area A73 according to the cross-section-2 in FIG. 7D.

Referring to FIG. 7B, the anti-fuse area A72 includes the conductive layer Mx, the via Vx and anti-fuse elements 712, 714. The anti-fuse element 712 includes a top conductive layer 7121, a common bottom conductive layer 7123/7143 and a dielectric layer 7122 located between the top conductive layer 7121 and the common bottom conductive layer 7123/7143. The anti-fuse element 714 includes a top conductive layer 7141, the common bottom conductive layer 7123/7143 and a dielectric layer 7142 located between the top conductive layer 7141 and the common bottom conductive layer 7123/7143. The top conductive layer 7121 of the anti-fuse element 712 and the top conductive layer 7141 of the anti-fuse element 714 are coupled to the conductive layer Mx through the via Vx.

As shown in FIG. 7C, the anti-fuse area A73 includes the conductive layer Mx, the via Vx, the lower-layer conductive layer Mx–1, and the via Vx–1. The conducive layer Mx is coupled to the lower-level conductive layer Mx–1 through the via Vx, and the lower conductive layer Mx–1 is coupled to the another conductive layer Mx–2 (not shown) or any other electronic components through a via Vx–1. The anti-fuse area A73 further includes the common bottom conductive layer 7123/7143 of the anti-fuse elements 712, 714.

FIG. 7D illustrates a top view layout of the anti-fuse elements 712 and 714 shown in FIGS. 7B and 7C. As shown in FIG. 7D, there are conductive layers M1 and M2, where the conductive layer M1 is configured to couple the top conductive layer 7121 of the anti-fuse elements 712 and the top conductive layer 7141 of the anti-fuse elements 714 to the program line PLx. The conductive layer M2 is configured to couple the common bottom conductive layer 7123/7143 to the source node of the control device.

Figures 8A, 8B, 8C:
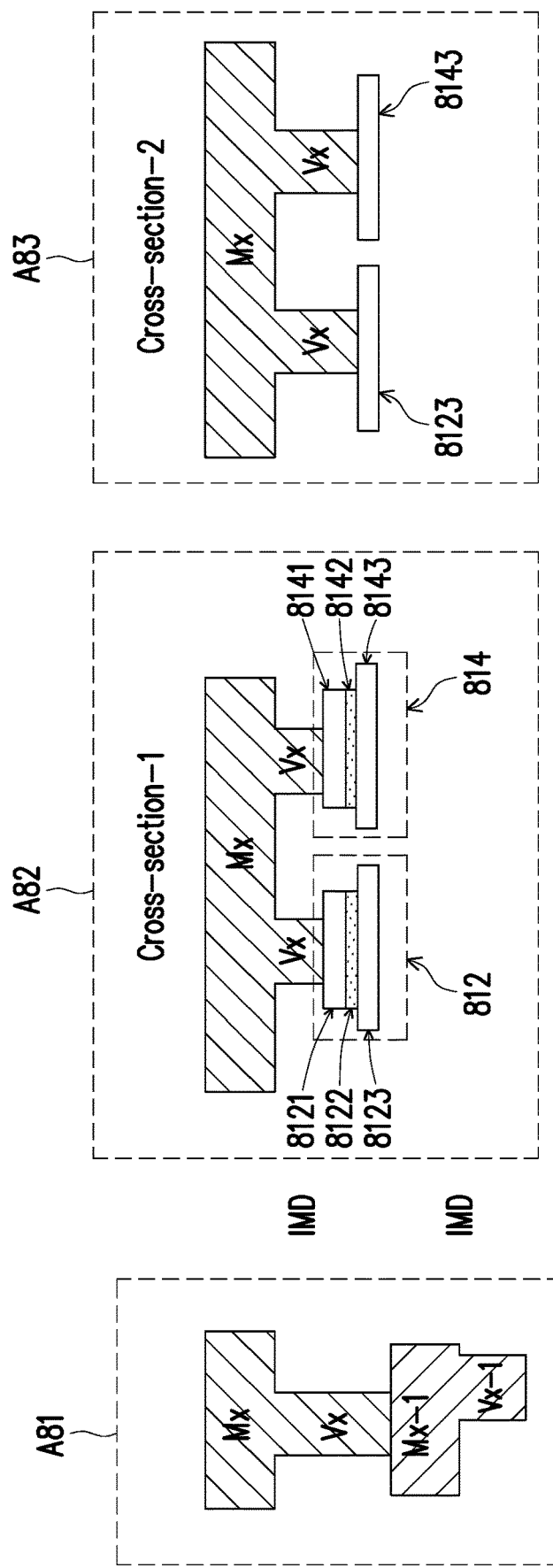
FIG. 8A to 8D illustrate different views of a non-anti-fuse area and an anti-fuse area according to another embodiment of the disclosure.

FIG. 8A to FIG. 8D illustrate different views of a non-anti-fuse area and an anti-fuse area according to some embodiments of the disclosure. A non-anti-fuse area A81 shown in FIG. 8A is similar to the non-anti-fuse area A71 shown in FIG. 7A, thus the detailed description about the non-anti-fuse area A81 is omitted hereafter.

Figure 8D:
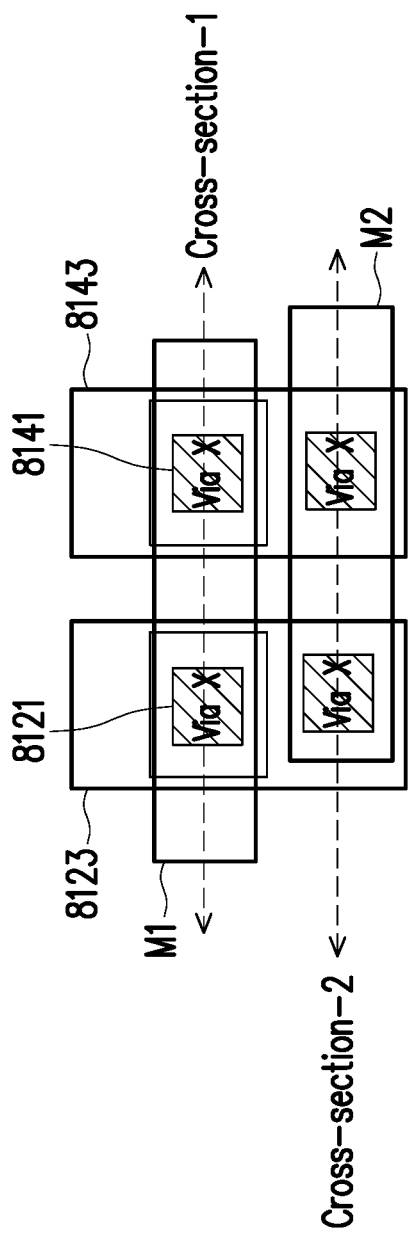

Referring to FIG. 8B to FIG. 8D, FIG. 8B shows an anti-fuse area A82 according to the cross-section-1 in FIG. 8D, and FIG. 8C shows an anti-fuse area A83 according to the cross-section-2 in FIG. 8D.

Referring to FIG. 8B, the anti-fuse area A82 includes the conductive layer Mx, the via Vx and anti-fuse elements 812, 814. The anti-fuse element 812 includes a top conductive layer 8121, a bottom conductive layer 8123 and a dielectric layer 8122 located between the top conductive layer 8121 and the bottom conductive layer 8123. The anti-fuse element 814 includes a top conductive layer 8141, a bottom conductive layer 8143 and a dielectric layer 8142 located between the top conductive layer 8141 and the bottom conductive layer 8143. The top conductive layer 7121 of the anti-fuse element 712 and the top conductive layer 7141 of the anti-fuse element 714 are coupled to the conductive layer Mx through the via Vx. A difference between FIG. 7B and FIG. 8B is that the anti-fuse elements 712 and 714 in FIG. 7B have the common bottom conductive layer 7123/7143 while the anti-fuse elements 812 and 814 in FIG. 8B have separated bottom conductive layers 7123 and 7143.

Referring to FIG. 8C, the anti-fuse area A83 includes the conductive layer Mx and the vias Vx. The conducive layer Mx is coupled to the bottom conductive layer 8123 through one of the vias Vx and is coupled to the bottom conductive layer 8143 through another one of the vias Vx.

FIG. 8D illustrates a top view layout of the anti-fuse elements 812 and 814 shown in FIGS. 8B and 8C. As shown in FIG. 8D, there are conductive layers M1 and M2, where the conductive layer M1 is configured to couple the top conductive layer 7121 of the anti-fuse elements 712 to the top conductive layer 7141 of the anti-fuse elements 714 to the program line PLx. The conductive layer M2 is configured to couple the bottom conductive layers 7123 of the anti-fuse element 712 to the bottom conductive layers 7143 of the anti-fuse element 714 to the source node of the control device.

Figure 9:
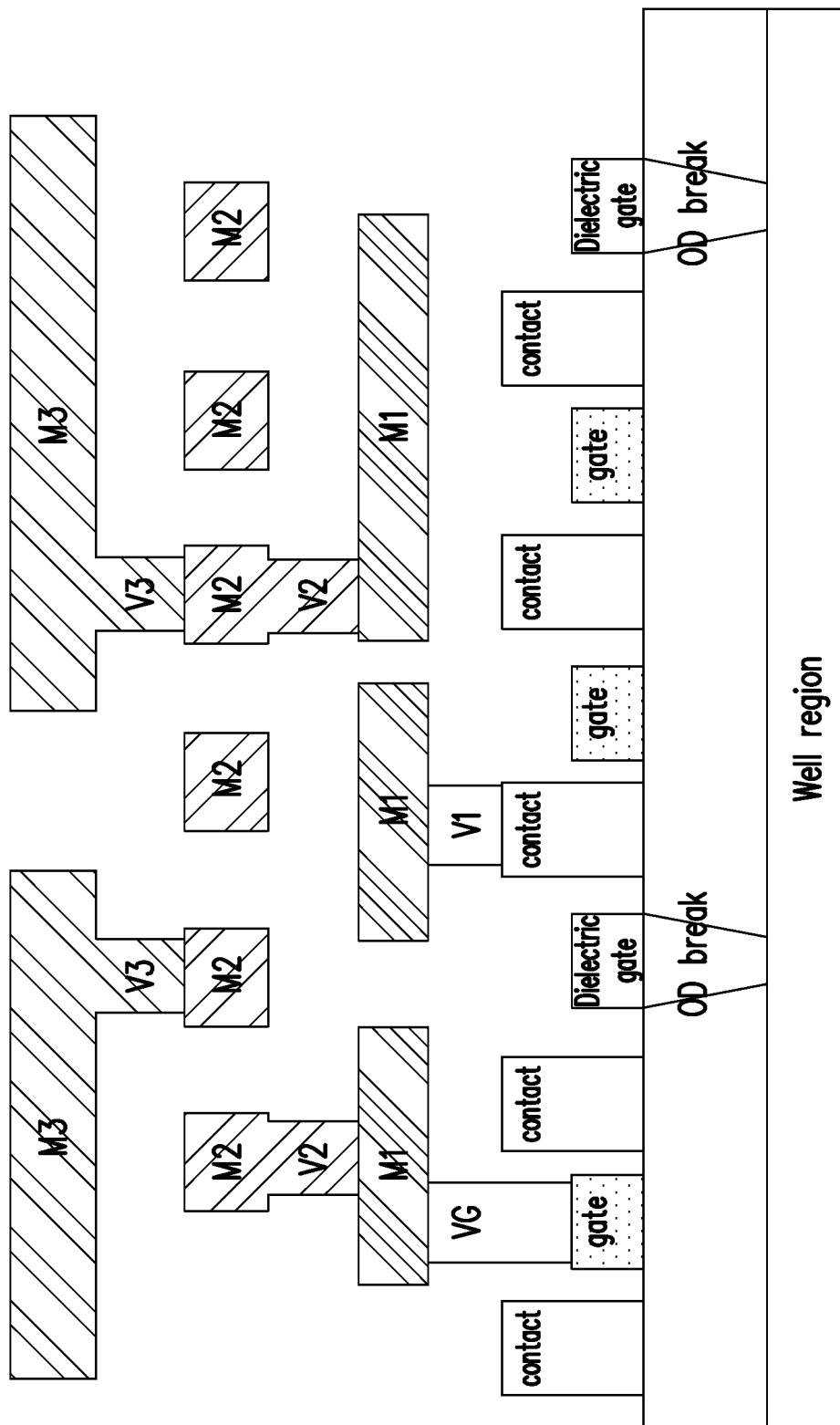
FIG. 9 illustrates a cross-sectional view of conductive layers in a chip according to an embodiment of the disclosure.

Referring to FIG. 9, a cross-sectional view of conductive layers in a chip is illustrated. The chip may include a substrate's well region, where a number of node contacts are formed on the well region. The node contacts may include gate node contacts, source node contacts and drain node contact. The chip may also include at least one oxide diffusion (OD) break formed between the node contacts.

The chip may include multiple-level conductive layers which are electrically coupled to each other through at least one via. As shown in FIG. 9, some of the node contacts are electrically coupled to the first-level conductive layer M1 through via V1 and via VG. The second-level conductive level M2 is coupled to the first conductive layer M1 through visa V2; and the third-level conductive layer M3 is coupled to the second conductive layer M2 through via V3. Even though FIG. 9 shows three conductive layer levels, a number of levels of the chip is set according to the designed needs.

Figure 10:
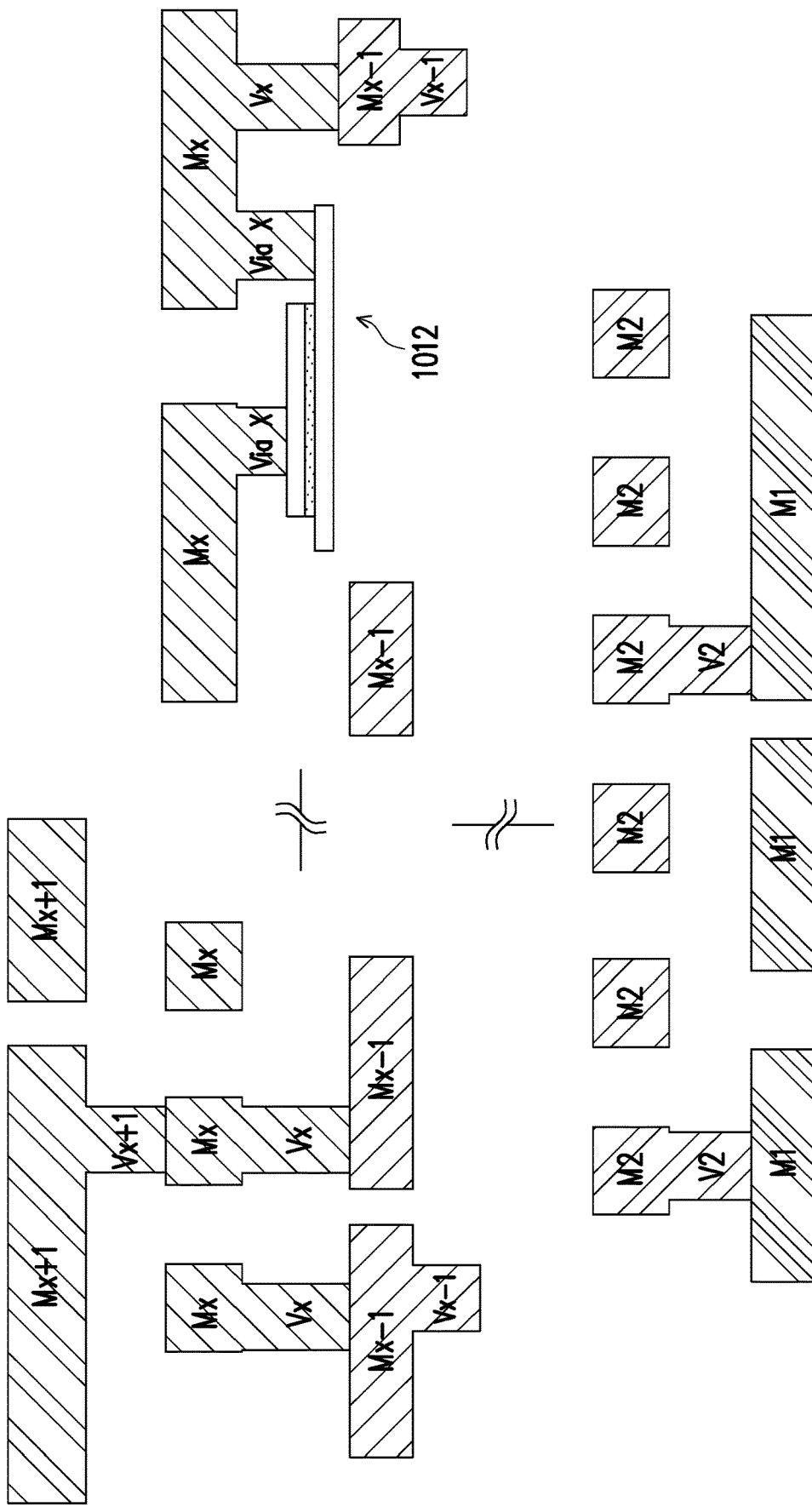
FIG. 10 illustrates a cross-sectional view of conductive layers in a chip according to another embodiment of the disclosure.

Referring to FIG. 10, a cross-sectional view of conductive layers in a chip according to another embodiment of the disclosure is illustrated. The chip includes a plurality of conductive layers M1 to Mx+1 coupled to each other through a plurality of vias V2 to Vx+1. The top conductive layer of an anti-fuse element 1012 is coupled to the conductive layer Mx through the via Vx, and the bottom conductive layer of the anti-fuse element 1012 is coupled to the conductive layer Mx−1.

In an embodiment of the disclosure, the chip includes at least ten conductive layers from the bottom layer (e.g., close to transistor layers) to the top layer (e.g., close to the passivation layer). The anti-fuse element 1012 is located at the third-level conductive layer M3 or at a higher level conductive layer than M3. In an embodiment of the disclosure, the conductive layer forming the word lines of the chip is located at a higher level than the conductive layer forming the bit lines of the chip.

In accordance with some embodiments of the disclosure, a chip having a plurality of anti-fuse cells is introduced. Each of the anti-fuse cells of the chip is coupled to a world line, a bit line and a program line; and each of the anti-fuse cells includes a control device and an anti-fuse element. The control device includes a source node, a drain node and a gate node, wherein the gate node is electrically coupled to the word line and the drain node is electrically coupled to the bit line. The anti-fuse element includes a first conductive layer, a second conductive layer and a dielectric layer. The dielectric layer is disposed between the first conductive layer and the second conductive layer, the first conductive layer is coupled to the program line, and the second conductive layer is electrically coupled to the source node of the control device.

In accordance with some embodiments of the disclosure, anti-fuse cell includes a control device and an anti-fuse element. The control device includes a source node, a drain node and a gate node, wherein the gate node is electrically coupled to the word line and the drain node is electrically coupled to the bit line. The anti-fuse element includes a first conductive layer, a second conductive layer and a dielectric layer, wherein the dielectric layer is disposed between the first conductive layer and the second conductive layer. The second conductive layer of the anti-fuse element is physically stacked upon a conductive layer and electrically connected to the source node of the control device, and first conductive layer is electrically coupled to the program line through a via.

In accordance with some embodiments of the disclosure, anti-fuse cell includes a control device, a first anti-fuse element and a second anti-fuse element. The first anti-fuse element includes a first conductive layer, a second conductive layer and a first dielectric layer, wherein the first dielectric layer is disposed between the first conductive layer and the second conductive layer. The second anti-fuse element includes a third conductive layer, a fourth conductive layer and a second dielectric layer, wherein the second dielectric layer is disposed between the third conductive layer and the fourth conductive layer. The first conductive layer and the third conductive layer are electrically coupled to the program line, and the second conductive layer and the fourth conductive layer are electrically coupled to the source node of the control device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip, comprising a plurality of anti-fuse cells, each of the anti-fuse cells being coupled to a world line, a bit line and a program line, each of the anti-fuse cells comprising:
   a control device, comprising a source node, a drain node and a gate node, wherein the gate node is electrically coupled to the word line and the drain node is electrically coupled to the bit line; and
   an anti-fuse element, comprising a first conductive layer, a second conductive layer and a dielectric layer, wherein the dielectric layer is disposed between the first conductive layer and the second conductive layer, the first conductive layer is coupled to the program line, and the second conductive layer is electrically coupled to the source node of the control device,
   wherein the bit line is coupled to the drain node of the control device through a first level via on a first level conductive layer of the chip, the anti-fuse element is located at a third level conductive layer of the chip, and the second third level conductive layer is higher than the first level conductive layer.

2. The chip of claim 1, wherein
   the first conductive layer is coupled to the program line through a via, and
   the second conductive layer is physically stacked upon a metal layer and the metal layer is electrically coupled to the source node of the control device.

3. The chip of claim 1, wherein the first conductive layer and second conductive layer of the anti-fuse element are formed by a single conductive material or a plurality of stacked materials selected from a group consisting of Ti, TiN, Ni, Mo, Pt, Co, Ru, W, TaN, Cu and a combination thereof.

4. The chip of claim 1, wherein the dielectric layer of the anti-fuse element is formed by a single dielectric material or a plurality of stacked dielectric materials selected from a group consisting of SiO2, SiOC, SiON, SiOCN, Si3N4, Carbon content oxide, Nitrogen content oxide, Carbon and Nitrogen content oxide, metal oxide dielectric, Hf oxide (HfO2), Ta oxide (Ta2O5), Ti oxide (TiO2), Zr oxide (ZrO2), Al oxide (Al2O3), Y oxide (Y2O3), multiple metal content oxide, and a combination thereof.

5. The chip of claim 1, each of the anti-fuse cells further comprising:
   a first via, a second via, a first conductive line and a second conductive line, wherein
   the first via and the first conductive line are coupled to the first conductive layer of the anti-fuse element,
   the second via and the second conductive line are coupled to the second conductive layer of the anti-fuse element,
   the first conductive line is coupled to the program line, and
   the second conductive line is coupled to the source node of the control device.

6. The chip of claim 1, wherein
   the word line is parallel to the program line in a first routing direction, and
   the bit line is substantially perpendicular to first routing direction.

7. The chip of claim 1, wherein
the word line is located at a fourth level conductive layer, the fourth level conductive layer is located upon the first level conductive layer, and
the program line is located at a fifth level conductive layer, wherein the fifth level conductive layer is higher than the fourth level conductive layer.

8. The chip of claim 7, wherein the plurality of the anti-fuse cell forms an array of anti-fuse cells, and the chip further comprising:
a plurality of landing pads, locating at a conductive layer that has lower level than the fifth level conductive layer, wherein the landing pads are configured to electrically coupled the program line to a driver circuit, the driver circuit is located outside the array of anti-fuse cells.

9. The chip of claim 8, wherein the landing pads are located at a boundary of the array of anti-fuse cells.

10. The chip of claim 8, the chip further comprising:
a plurality of non-anti-fuse cells, wherein the non-anti-fuse cells are located in a non-anti-fuse area, each of the anti-fuse elements of the anti-fuse cells are located in an anti-fuse area, and the non-anti-fuse area is separated from the anti-fuse area by at least one inter metal dielectric film.

11. The chip of claim 10, wherein
each of the non-anti-fuse area and the anti-fuse area comprises a first etch stop dielectric layer and a second etch stop dielectric layer, and
the landing pads are located between the first etch stop dielectric layer and the second etch stop dielectric layer.

12. The chip of claim 11, wherein the non-anti-fuse area further comprises:
an extra etch stop dielectric layer, located upon the first etch stop dielectric layer and the second etch stop dielectric layer.

13. An anti-fuse cell, being coupled to a world line, a bit line and a program line, the anti-fuse cell comprising:
a control device, comprising a source node, a drain node and a gate node, wherein the gate node is electrically coupled to the word line and the drain node is electrically coupled to the bit line; and
an anti-fuse element, comprising a first conductive layer, a second conductive layer and a dielectric layer, wherein the dielectric layer is disposed between the first conductive layer and the second conductive layer,
wherein the second conductive layer of the anti-fuse element is physically stacked upon a conductive layer and electrically connected to the source node of the control device, and first conductive layer is electrically coupled to the program line through a via,
wherein the bit line is coupled to the drain node of the control device through a first level via on a first level conductive layer, the anti-fuse element is located at a second third level conductive layer, and the second third level conductive layer is higher than the first level conductive layer.

14. The anti-fuse cell of claim 13, wherein the first conductive layer and second conductive layer of the anti-fuse element are formed by a single conductive material or a plurality of stacked materials selected from a group consisting of Ti, TiN, Ni, Mo, Pt, Co, Ru, W, TaN, Cu or a combination thereof.

15. The anti-fuse cell of claim 13, wherein the dielectric layer of the anti-fuse element is formed by a single dielectric material or a plurality of stacked dielectric materials selected from a group consisting of SiO2, SiOC, SiON, SiOCN, Si3N4, Carbon content oxide, Nitrogen content oxide, Carbon and Nitrogen content oxide, metal oxide dielectric, Hf oxide (HfO2), Ta oxide (Ta2O5), Ti oxide (TiO2), Zr oxide (ZrO2), Al oxide (Al2O3), Y oxide (Y2O3), multiple metal content oxide, or a combination thereof.

16. The anti-fuse cell of claim 13, further comprising:
a first via, a second via, a first conductive line and a second conductive line, wherein
the first via and the first conductive line are coupled to the first conductive layer of the anti-fuse element,
the second via and the second conductive line are coupled to the second conductive layer of the anti-fuse element,
the first conductive line is coupled to the program line,
the second conductive line is coupled to the source node of the control device the word line is parallel to the program line in a first routing direction, and
the bit line is substantially perpendicular to first routing direction.

17. An anti-fuse cell, being coupled to a world line, a bit line and a program line, the anti-fuse cell comprising:
a control device, comprising a source node, a drain node and a gate node, wherein the gate node is electrically coupled to the word line and the drain node is electrically coupled to the bit line;
a first anti-fuse element, comprising a first conductive layer, a second conductive layer and a first dielectric layer, wherein the first dielectric layer is disposed between the first conductive layer and the second conductive layer; and
a second anti-fuse element, comprising a third conductive layer, a fourth conductive layer and a second dielectric layer, wherein the second dielectric layer is disposed between the third conductive layer and the fourth conductive layer,
wherein the first conductive layer and the third conductive layer are electrically coupled to the program line, and the second conductive layer and the fourth conductive layer are electrically coupled to the source node of the control device.

18. The anti-fuse cell of claim 17, wherein the first anti-fuse element is adjacent and parallel to the second anti-fuse element.

19. The anti-fuse cell of claim 17, wherein the first conductive layer and second conductive layer of the anti-fuse element are formed by a single conductive material or a plurality of stacked materials selected from a group consisting of Ti, TiN, Ni, Mo, Pt, Co, Ru, W, TaN, Cu or a combination thereof.

20. The anti-fuse cell of claim 17, wherein the dielectric layer of the anti-fuse element is formed by a single dielectric material or a plurality of stacked dielectric materials selected from a group consisting of SiO2, SiOC, SiON, SiOCN, Si3N4, Carbon content oxide, Nitrogen content oxide, Carbon and Nitrogen content oxide, metal oxide dielectric, Hf oxide (HfO2), Ta oxide (Ta2O5), Ti oxide (TiO2), Zr oxide (ZrO2), Al oxide (Al2O3), Y oxide (Y2O3), multiple metal content oxide, or a combination thereof.

* * * * *